(12) United States Patent
Choi et al.

(10) Patent No.: US 6,560,047 B2
(45) Date of Patent: May 6, 2003

(54) IMAGE MODULE

(75) Inventors: Woon Ha Choi, Seoul (KR); Young Jun Kim, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/975,846

(22) Filed: Oct. 11, 2001

(65) Prior Publication Data
US 2003/0043478 A1 Mar. 6, 2003

(30) Foreign Application Priority Data
Aug. 29, 2001 (KR) .............................. 01-52521

(51) Int. Cl.$^7$ .............................. G02B 7/02; H01J 5/16; H01J 40/14; H01J 5/02; G11B 7/00

(52) U.S. Cl. ..................... 359/824; 359/814; 359/811; 250/216; 250/239; 369/44.15

(58) Field of Search ................. 359/814, 824, 359/813, 811; 369/44.14–44.16, 216, 239; 250/216, 208.1, 239

(56) References Cited

U.S. PATENT DOCUMENTS 5,321,678 A * 6/1994 Takishima ............... 369/44.14
6,483,101 B1 * 11/2002 Webster ..................... 250/216

* cited by examiner

Primary Examiner—Georgia Epps
Assistant Examiner—William Choi
(74) Attorney, Agent, or Firm—Darby & Darby

(57) ABSTRACT

Disclosed is an image module having a function of an automatic focus adjustment based on a COB system for miniaturization and unification. The image module includes an image packaging unit, which comprises a sensor for sensing a picture image, a substrate including the sensor, a sensor cover for covering the sensor and the substrate at the outside and a sensor filter for blocking an outer environment and passing light between the sensor cover and the sensor only; and a lens blade unit, which comprises a lens blade having a lens to transmit the light at a center and a driving coil on a surface thereof, an elastic means for supplying a current to the driving coil of the lens blade and supporting the lens blade, and a magnet for forming a magnetic field to enable the lens blade to shift up and down due an electromagnetic force, and thereby lowering power consumption and production cost and improving reliability on a product thereof.

8 Claims, 3 Drawing Sheets

IMAGE MODULE

BACKGROUND OF THE INVENTION

1. Field of the Invention

The present invention relates to a small-sized thin image module based on an automatic lens focusing method.

2. Description of the Related Art

In general, an image module is used for digital cameras and picture telecommunication terminals, in which the image module carries out a function of image capture, making it easier to connect to the picture telecommunication or an intended content through connecting the image module to a computer. For the reason, the use of the image module has been gradually increasing.

Especially, as a new telecommunication method using a computer is under development and an infra therefore is being built, the image module is needed more than ever.

Generally, an image sensor for the digital camera and the picture telecommunication terminal can be classified into a charge coupled device (hereinafter, referred as CCD) system and complementary metal-oxide semiconductor (hereinafter, referred as CMOS) system.

The typical CCD is an optical system based on an analog circuit. According to the CCD system, when a light is transmitted from a lens to a plurality of cells, electric charge thereof is saved in each cell. Through the intensity of the electric charge, the intensity of the light (or brightness) is detected, and the light is sent to an analog/digital converter to exhibit colors.

On the other hand, the CMOS image sensor follows the exactly same method employed in a CMOS semiconductor process, system-on-chip. Thus, in accordance with the CMOS system, a circuit for processing an analog signal and a digital signal is integrated in a semiconductor.

Since the CMOS image sensor is manufactured by a general CMOS process, it is relatively advantageous in terms of production cost compared with the CCD image sensor that undergoes a complicated process at a low yield. However, the CMOS has a small region for processing a video signal, being unable to manifest fine images and distinguish elaborate colors, so it is still behind of the CCD in picture qualities.

The CMOS image sensor for the reasons described above has been disregarded in the field of digital cameras in overall. With a rapid development in the technology of the CMOS image sensor, however, the CMOS is expected to replace the CCD in most of application equipment in near future, and the CCD will be used mainly for the parts requiring a high resolution image instead.

Keeping with the recent trend of the technology, the present invention provides a lens including an image sensor described above, particularly an automatic focus adjuster. A construction of a lens according to a related art is now explained with reference with a figure.

FIG. 1 is a systematic view of an image sensor in a digital camera and a picture telecommunication terminal and a focus adjuster of a lens according to a related art.

As shown in FIG. 1, the lens focus adjuster in the related art includes an image packaging that includes a sensor 1 for sensing a picture image, a substrate 2 including the sensor, a sensor cover 3 covering the sensor and the substrate from the outside and a sensor filter 4 for blocking light from the outside and passing the light between the sensor cover and the sensor only; a housing 5 having a screw tap combined with the image packaging; a barrel 6 including a screw tap 6a connected to an inner screw tap 5a of the housing 5; and a lens 7 inside the barrel.

The operation of the focus adjuster of the lens according to the related art is also explained below with reference with FIG. 1.

First of all, if a user wishes to adjust the focus, as illustrated in FIG. 1, he or she can adjust a distance to an object manually by forming the screw tap 6a at the peripheral side of the barrel 6 including the lens 7 inside.

In other words, the user holds the outside of the lens and adjusts the focus by turning the screw tap 6a. Unfortunately, the method of the related art proved to be disadvantageous and uncomfortable in many ways because the user had to shift the lens 7 near or far from the image sensor 1 by watching the picture directly, and precision thereof was not that satisfactory despite of much efforts made by the user.

SUMMARY OF THE INVENTION

It is, therefore, an object of the present invention to provide an image module having an automatic focus adjuster in accordance with chip on board (COB) system for miniaturization and integration in order to lower power consumption and production cost and improve reliability on a product.

To achieve the object of the present invention, there is provided an image module equipped with an automatic focus adjuster, including an image packaging unit that comprises a sensor for sensing a picture image, a substrate including the sensor, a sensor cover for covering the sensor and the substrate at the outside and a sensor filter for blocking an outer environment and passing light between the sensor cover and the sensor only; a lens blade unit that comprises a lens blade having a lens to transmit the light at a center and a driving coil on a surface thereof; an elastic means for supplying the current to the driving coil of the lens blade; and a magnet for forming a magnetic filed to help the lens blade to shift up and down due an electromagnetic force.

BRIEF DESCRIPTION OF THE DRAWINGS

The above objects, features and advantages of the present invention will become more apparent from the following detailed description when taken in conjunction with the accompanying drawings, in which.

DETAILED DESCRIPTION OF THE PREFERRED EMBODIMENT

Figure 1:
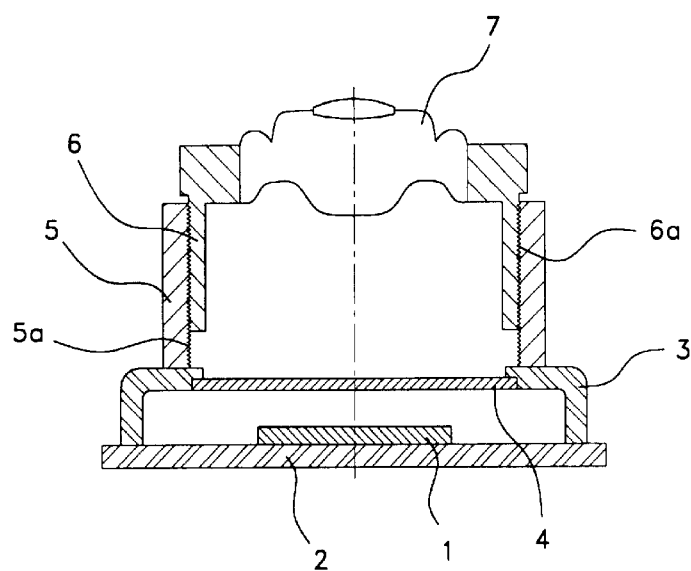
FIG. 1 is a systematic view showing a focus adjuster of a lens according to an embodiment of a related art.

A preferred embodiment of the present invention will now be described with reference to the accompanying drawings. In the following description, same drawing reference numerals are used for the same elements even in different drawings. The matters defined in the description such as a detailed construction and elements of a circuit are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

The present invention is explained in more detail with reference with figure illustrating a PC camera.

Figure 2:
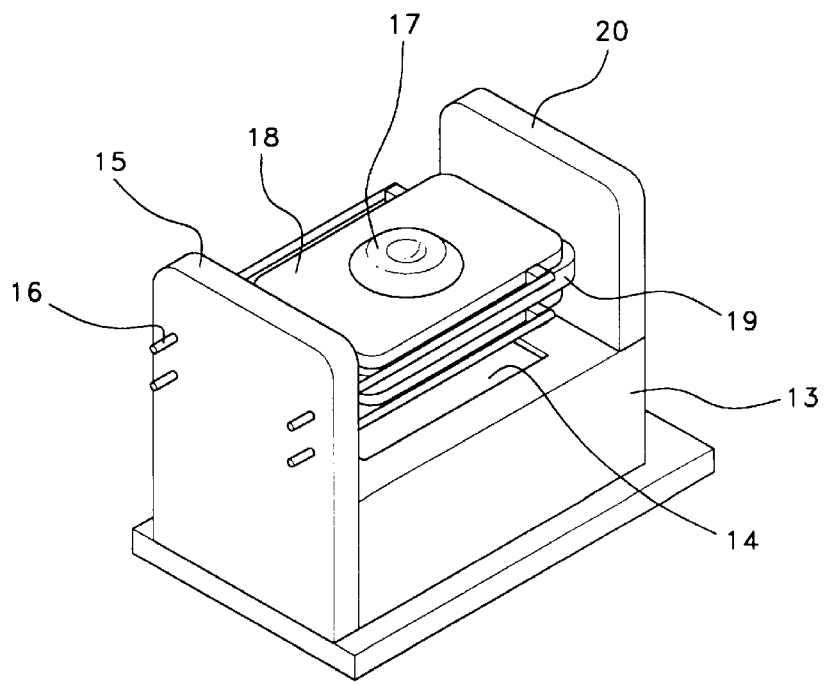
FIG. 2 is a prospective view showing an image module having a function of automatic focus adjustment according to a preferred embodiment of the present invention.
Figure 3:
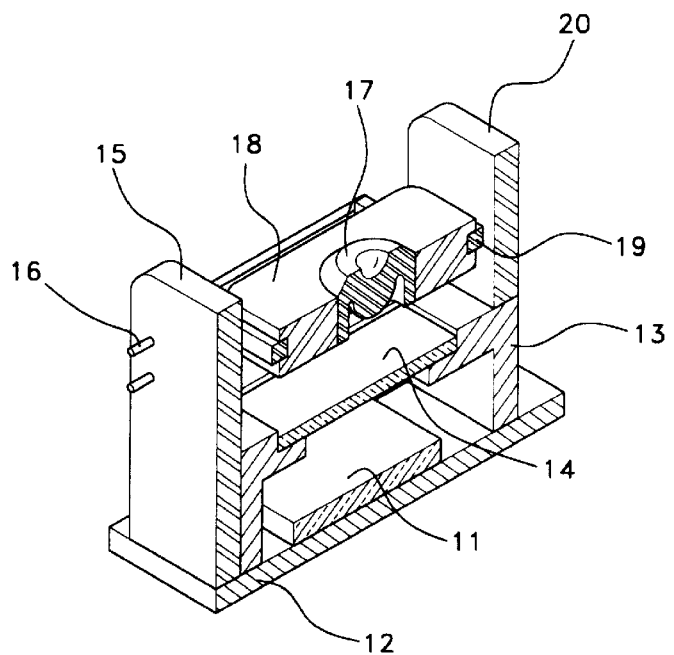
FIG. 3 is a cross sectional view of an image module shown in FIG. 2.

FIG. 2 is a prospective view of the image module equipped with the automatic focus adjuster according to the present invention; and FIG. 3 is a cross sectional view of the image module illustrated in FIG. 2.

As shown in FIG. 3, the image module with the automatic focus adjuster of the present invention can be divided largely into the image packaging unit and the lens blade unit. The image packaging unit includes a sensor 11, a substrate 12, a sensor cover 13 and a sensor filter 14. Here, the sensor 11 detects picture image data. Also, the sensor 11 is positioned on the substrate 12 and formed of chip on board (COB). The sensor cover 13 covers the sensor 11 and the substrate 12 from the outside. Lastly, the sensor filter 14 blocks the outside environment and passes the light between the sensor cover 13 and the sensor 11 only.

In addition, the lens blade unit acts as an actuator. The lens blade unit includes an elastic means 16 to which the current from the outside is applied, a coil 19 wound around for the induced current by the elastic means to flow, a magnet 20 that forms an electromagnetic field due to the current flowing in the coil, a lens blade 18 that receives the electromagnetic force generated by the coil and the magnet, and a lens 17 that shifts up and down, being connected to the center of the lens blade.

Figure 4:
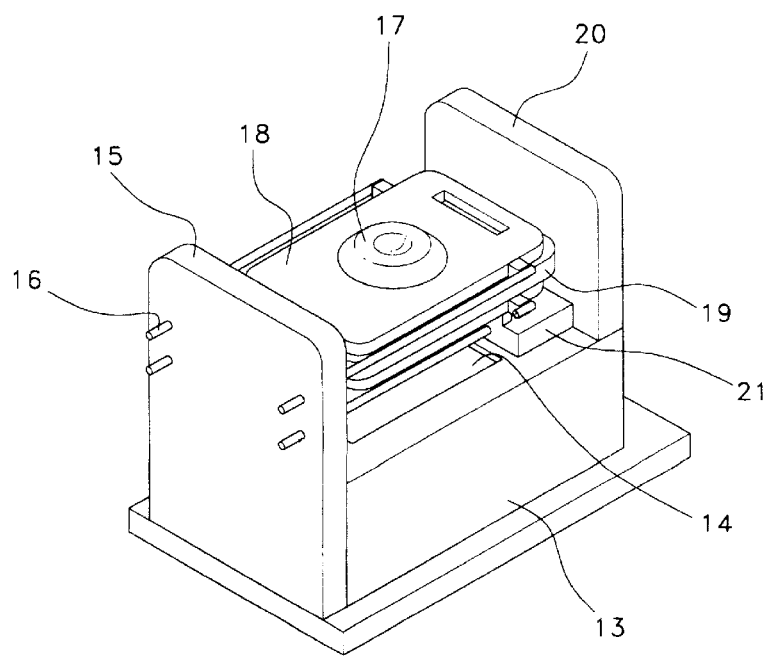
FIG. 4 is a cross sectional view of another preferred embodiment of the present invention.
Figure 5:
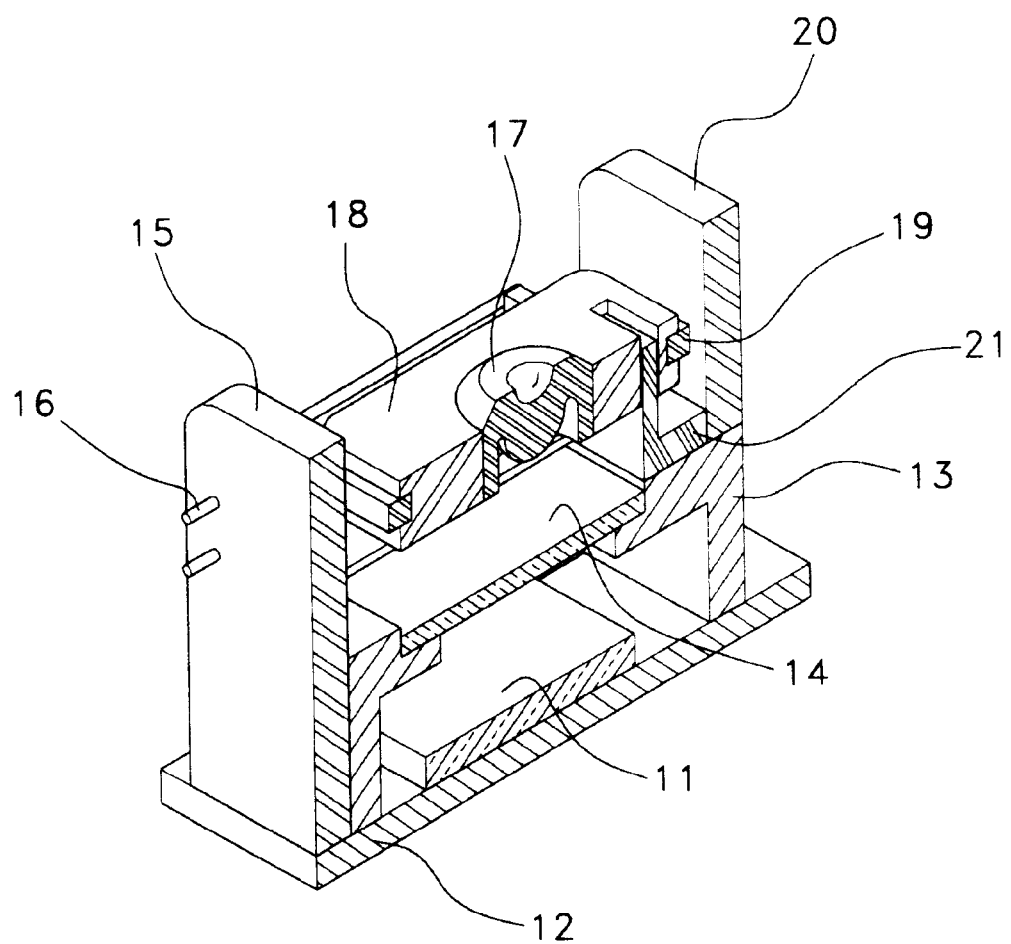
FIG. 5 is a cross sectional view of FIG. 4.

Preferably, a yoke 21 can be further installed in a way to increase an efficiency of the magnet. FIG. 4 shows another preferred embodiment of the present invention with the yoke. FIG. 5 is a cross sectional view of FIG. 4. In FIGS. 4 and 5, the yoke 21 forms a 'u' shape and increases the efficiency of the magnetic flux, which consequently improves the driving force.

The filter can be formed of glass, and more preferably, coated glass. Also, a holder 15 is further installed at the outside of the sensor cover to support the elastic means.

The elastic means can be made of a coil spring, and if necessary, a plate spring. When the holder 15 and the elastic means 16 are fabricated together, a damper can be inserted around a fabrication hole to protect the product from any foreign shock.

More specifically, four holders at both ends, two holders on the upper and lower sides support the elastic means according to an embodiment of the present invention. The application of the embodiment can be varied in many ways. For example, it is always possible to support the elastic means by using two holders, one at the top and the other at the bottom.

The operation of the image module with the automatic focus adjuster in accordance with the present invention is now explained in more detail.

As shown in FIG. 2, if a wire is connected to the end of the elastic means 16 from the outside, the current is induced thereby. Through the elastic means 16, the induced current flows in the spool shaped coil 19 wound around the outside of the lens blade 18. Accordingly, an induced electromotive force is generated by the coil, and an electromagnetic filed is formed due to the magnet 20 nearby the coil 19, or a permanent magnet. In the electromagnetic field, the electromagnetic force is generated, and the lens blade 18 shifts up and down according to the Fleming's left-hand rule. Accordingly, the lens 17 connected to the lens blade 18 is adjusted to be close or far from the image sensor 11.

In the meantime, the driving direction of the lens 17 is changed when the current is applied to the elastic means 16 from the opposite direction. The shift distance at this time is approximately from $\frac{1}{10}$ mm to approximately $\frac{1}{2}$ mm, which is sufficient for focusing a picture on the image sensor 11 very precisely. The driving direction and the shift distance of the lens, therefore, can be adjusted to the direction and intensity of the current after sensing the perspective of the lens based on the picture image data from the image sensor.

The image module with the automatic focus adjuster of the present invention can be applied to a PC connected camera. The user can adjust the focus automatically by inducing current variation using an automatic image analysis program, or adjust the focus arbitrarily while watching the monitor screen, for example, by using a mouth in order to induce current variation.

In addition, the image module with the automatic focus adjuster of the present invention can be applied to every kind of sensor installment equipment requiring the focus adjustment including a simple mobile type monitor that is typically used in the related art. Although the user had to turn the lens or use the driving system such as a motor or a solenoid system in order to focus, it is now possible to adjust the focus automatically or simply operating a button.

Therefore, the present invention provides the image module with the function of the automatic focus adjustment in a simple structure, being appropriate for the small-sized thin type compared to that of the related art. The image module of the present invention can be widely applied to PC cameras, digital cameras and picture telecommunication terminals. Also, the present invention is very useful from a viewpoint that the image module of the present invention is easily installed, so a large number of small and low-cost image application equipments can adopt the image module from now on.

As explained hitherto, the image module with the automatic focus adjuster based on the miniaturized and unified COB system, when applied to every kind of small-sized and low-priced image application equipments, lowers power consumption and production cost, and improves reliability on the production.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An image module with a function of an automatic focus adjustment, the module comprising:

a sensor for sensing a picture image data;

a substrate including the sensor a sensor cover for covering the sensor and the substrate from an outside;

a sensor filter for blocking an outer environment and passing a light between the sensor cover and the sensor only;

a lens blade having a lens to transmit the light at a center and a driving coil on a surface thereof;

an elastic means for supplying a current to the driving coil of the lens blade and supporting the lens blade; and a magnet for forming a magnetic field to enable the lens blade to shift up and down due to an electromagnetic force.

2. The image module of claim 1, wherein the filter is made of glass.

3. The image module of claim 1, further comprising a holder on an outside of the sensor cover in order to support the elastic means.

4. The image module of claim 1, further comprising a yoke in order to increase an efficiency of the magnet.

5. An image module having a function of an automatic focus adjustment, the module comprising:

an image packaging unit, which comprises a sensor for sensing a picture image, a substrate including the sensor, a sensor cover for covering the sensor and the substrate at the outside and a sensor filter for blocking an outer environment and passing light between the sensor cover and the sensor only; and a lens blade unit, which comprises a lens blade having a lens to transmit the light at a center and a driving coil on a surface thereof, an elastic means for supplying a current to the driving coil of the lens blade and supporting the lens blade, and a magnet for forming a magnetic field to enable the lens blade to shift up and down due to an electromagnetic force.

6. The image module of claim 5, wherein the filter is made of glass.

7. The image module of claim 5, further comprising a holder on an outside of the sensor cover in order to support the elastic means.

8. The image module of claim 5, further comprising a yoke in order to increase an efficiency of the magnet.

* * * * *

(12) EX PARTE REEXAMINATION CERTIFICATE (8924th)
United States Patent
Choi et al.

(10) Number: US 6,560,047 C1
(45) Certificate Issued: Mar. 27, 2012

(54) IMAGE MODULE

(75) Inventors: Woon Ha Choi, Seoul (KR); Young Jun Kim, Suwon (KR)

(73) Assignee: Samsung Electro-Mechanics Co., Ltd., Kyungki-Do (KR)

Reexamination Request:
No. 90/008,993, Mar. 20, 2008

Reexamination Certificate for:
Patent No.: 6,560,047
Issued: May 6, 2003
Appl. No.: 09/975,846
Filed: Oct. 11, 2001

(30) Foreign Application Priority Data

Aug. 29, 2001 (KR) .......................................... 01-52521

(51) Int. Cl.
*G02B 7/02* (2006.01)

(52) U.S. Cl. .................. 359/824; 250/216; 250/239; 257/E31.117; 257/E31.127; 348/E5.027; 348/E5.045; 359/811; 359/814; 369/44.15

(58) Field of Classification Search .................. None
See application file for complete search history.

(56) References Cited

To view the complete listing of prior art documents cited during the proceeding for Reexamination Control Number 90/008,993, please refer to the USPTO's public Patent Application Information Retrieval (PAIR) system under the Display References tab.

*Primary Examiner* — Minh T Nguyen

(57) ABSTRACT

Disclosed is an image module having a function of an automatic focus adjustment based on a COB system for miniaturization and unification. The image module includes an image packaging unit, which comprises a sensor for sensing a picture image, a substrate including the sensor, a sensor cover for covering the sensor and the substrate at the outside and a sensor filter for blocking an outer environment and passing light between the sensor cover and the sensor only; and a lens blade unit, which comprises a lens blade having a lens to transmit the light at a center and a driving coil on a surface thereof, an elastic means for supplying a current to the driving coil of the lens blade and supporting the lens blade, and a magnet for forming a magnetic field to enable the lens blade to shift up and down due an electromagnetic force, and thereby lowering power consumption and production cost and improving reliability on a product thereof.

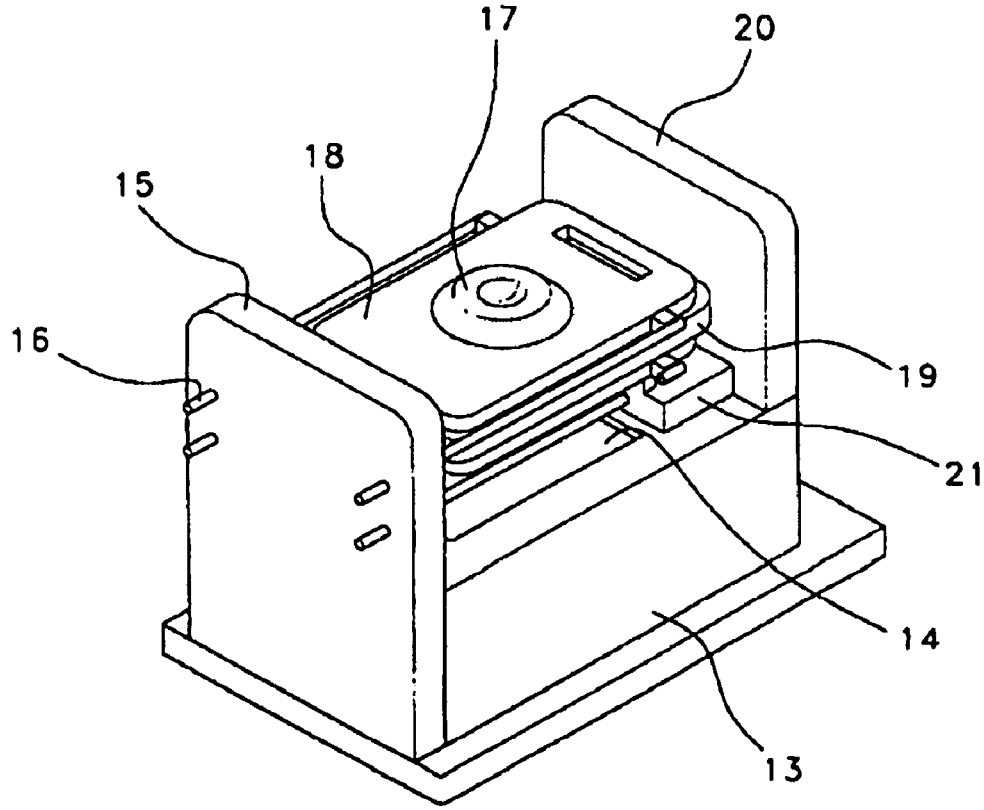

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-8 are cancelled.

* * * * *